United States Patent
Chindo

(10) Patent No.: US 9,007,136 B2
(45) Date of Patent: Apr. 14, 2015

(54) LIGHT-EMITTING DEVICE MODULE AND ATOMIC OSCILLATOR

(71) Applicant: Seiko Epson Corporation, Tokyo (JP)

(72) Inventor: Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 132 days.

(21) Appl. No.: 13/759,360

(22) Filed: Feb. 5, 2013

(65) Prior Publication Data

US 2013/0200955 A1 Aug. 8, 2013

(30) Foreign Application Priority Data

Feb. 7, 2012 (JP) ................. 2012-024160

(51) Int. Cl.
| | | |
|---|---|---|
| H01S 5/183 | (2006.01) | |
| F21V 29/00 | (2006.01) | |
| H03B 17/00 | (2006.01) | |
| H01S 4/00 | (2006.01) | |
| H01S 5/06 | (2006.01) | |
| H01S 5/068 | (2006.01) | |
| H03L 7/26 | (2006.01) | |
| H01S 5/022 | (2006.01) | |

(52) U.S. Cl.
CPC .............. *F21V 29/00* (2013.01); *H03B 17/00* (2013.01); *H01S 4/00* (2013.01); *H01S 5/02276* (2013.01); *H01S 5/0612* (2013.01); *H01S 5/06804* (2013.01); *H01S 5/183* (2013.01); *H03L 7/26* (2013.01); *H01L 2224/48137* (2013.01); *H01L 2224/48091* (2013.01)

(58) Field of Classification Search
USPC ................. 331/94.1; 372/34, 36, 44, 50
See application file for complete search history.

(56) References Cited

U.S. PATENT DOCUMENTS

| | | | | |
|---|---|---|---|---|
| 4,092,614 | A * | 5/1978 | Sakuma et al. | 372/36 |
| 6,320,472 | B1 | 11/2001 | Vanier | |
| 6,806,784 | B2 | 10/2004 | Hollberg et al. | |
| 7,973,611 | B2 * | 7/2011 | Abbink et al. | 331/94.1 |
| 2001/0033592 | A1 * | 10/2001 | Yamauchi et al. | 372/50 |
| 2003/0210719 | A1 * | 11/2003 | Yamamoto et al. | 372/36 |
| 2009/0059979 | A1 | 3/2009 | Tanaka | |

FOREIGN PATENT DOCUMENTS

| | | |
|---|---|---|
| JP | 61-258531 | 11/1986 |
| JP | 06-066689 | 8/1994 |
| JP | 2001-168805 | 6/2001 |
| JP | 2007-324818 | 12/2007 |
| JP | 2009-064829 | 3/2009 |
| JP | 2009-141048 | 6/2009 |
| JP | 2009-164332 | 7/2009 |
| WO | 2006-017345 | 2/2006 |

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A light-emitting device module includes a temperature variable device including a temperature control surface subjected to temperature control, a light-emitting device including a first electrode and mounted on a portion of the temperature control surface, a first terminal for supplying electric power to the first electrode, and a wire that causes the first terminal and the first electrode to conduct. The wire is thermally connected to the other portion of the temperature control surface.

14 Claims, 9 Drawing Sheets

LIGHT-EMITTING DEVICE MODULE AND ATOMIC OSCILLATOR

BACKGROUND

1. Technical Field

The present invention relates to a light-emitting device module and an atomic oscillator.

2. Related Art

An atomic oscillator by an electromagnetically induced transparency (EIT) system (also referred to as coherent population trapping (CPT) system) is an oscillator that makes use of a phenomenon in which, when two kinds of resonance light having coherency and having specific wavelengths (frequencies) different from each other are simultaneously irradiated on an alkali metal atom, absorption of the resonance light stops (see U.S. Pat. No. 6,320,472).

The atomic oscillator can realize a highly accurate oscillator by accurately controlling a frequency difference between two kinds of light as explained above. As a light-emitting device that emits such two kinds of light, for example, a semiconductor laser is used.

A light-emitting device is desirably subjected to temperature control at high accuracy. For example, if the temperature of the light-emitting device deviates from a desired temperature, the frequency of light emitted from the light-emitting device fluctuates and frequency accuracy of the light-emitting device is deteriorated. In particular, when the light-emitting device is used as a light source for an atomic oscillator, as explained above, it is necessary to accurately control a frequency difference between two kinds of light. Therefore, even a small fluctuation in frequencies causes a problem.

SUMMARY

An advantage of some aspects of the invention is to provide a light-emitting device module that can suppress a temperature fluctuation of a light-emitting device and an atomic oscillator including the light-emitting device module.

An aspect of the invention is directed to a light-emitting device module including: a temperature variable device including a temperature control surface subjected to temperature control; a light-emitting device including a first electrode and mounted on a portion of the temperature control surface; a first terminal for supplying electric power to the first electrode; and a wire that causes the first terminal and the first electrode to conduct. The wire is thermally connected to the other portion of the temperature control surface.

With the light-emitting device module according to an aspect of the invention, the first electrode and the first terminal are electrically connected via the temperature control surface controlled to a desired temperature. Therefore, it is possible to suppress the temperature of the light-emitting device from deviating from the desired temperature. The light-emitting device module can have high frequency accuracy.

For example, if the first terminal and the first electrode are electrically connected by the wire not via the temperature control surface (i.e., one end of the wire is joined to the first terminal and the other end is joined to the first electrode), in some case, the light-emitting device is affected by temperature outside a package (outdoor temperature) through the first terminal and the wire and the temperature of the light-emitting device fluctuates. More specifically, when the outdoor temperature is lower than the temperature of the temperature control surface, the heat of the semiconductor device heated by the temperature control surface to temperature same as (or close to) the temperature of the temperature control surface is radiated through the wire and the first terminal. Conversely, when the outdoor temperature is higher than the temperature of the temperature control surface, heat flows into the semiconductor device through the wire and the first terminal. Therefore, in such a form, the temperature of the light-emitting device deviates from the desired temperature.

With the light-emitting device module according to the aspect, it is possible to solve the problem explained above and suppress a temperature fluctuation of the light-emitting device.

The light-emitting device module according to the aspect of the invention may be configured such that the wire includes a first wire, one end of which is jointed to the first terminal and the other end of which is thermally connected to the other portion of the temperature control surface and a second wire, one end of which is joined to the first electrode and the other end of which is thermally connected to the other portion of the temperature control surface.

With the light-emitting device module of this configuration, it is possible to heat the light-emitting device and absorb the heat of the light-emitting device via the first wire and the second wire and suppress the temperature of the light-emitting device from deviating from the desired temperature.

The light-emitting device module according to the aspect of the invention may be configured such that the temperature control surface has electrical conductivity, the wire includes a first wire, one end of which is joined to the first terminal and the other end of which is joined to the other portion of the temperature control surface, and the first terminal and the first electrode conduct via the temperature control surface.

With the light-emitting device module of this configuration, it is possible to suppress the temperature of the light-emitting device from deviating from the desired temperature.

The light-emitting device module according to the aspect of the invention may be configured such that the first electrode is arranged on a surface other than amounting surface in the light-emitting device, and the light-emitting device module further includes a second wire that connects the other portion of the temperature control surface and the first electrode.

With the light-emitting device module of this configuration, it is possible to suppress the temperature of the light-emitting device from deviating from the desired temperature.

The light-emitting device module according to the aspect of the invention may be configured such that the first electrode is joined to the temperature control surface.

With the light-emitting device module of this configuration, it is possible to electrically connect the first terminal to the first electrode via the first wire and the conductive temperature control surface without using the second wire electrically connected to the first electrode and the temperature control surface.

The light-emitting device module according to the aspect of the invention may be configured to further include: a first insulating member mounted on the other portion of the temperature control surface; and a first pad arranged on the surface of the first insulating member. The other end of the first wire and the other end of the second wire may be joined to the first pad.

With the light-emitting device module of this configuration, even if the temperature control surface does not have electrical conductivity, it is possible to thermally connect the other end of the first wire and the other end of the second wire to the temperature control surface while electrically connecting the ends.

The light-emitting device module according to the aspect of the invention may be configured such that the light-emitting device includes a second electrode, and the light-emitting device module further includes: a second terminal for supplying electric power to the second electrode; a second insulating member mounted on the other portion of the temperature control surface; a second pad arranged on the surface of the second insulating member; a third wire, one end of which is joined to the second terminal and the other end of which is joined to the second pad; and a fourth wire, one end of which is joined to the second electrode and the other end of which is joined to the second pad.

With the light-emitting device module of this configuration, even if the temperature control surface does not have electrical conductivity, it is possible to thermally connect the other end of the third wire and the other end of the fourth wire to the temperature control surface while electrically connecting the ends.

The light-emitting device module according to the aspect of the invention may be configured such that the light-emitting device module includes a plurality of the second wires.

With the light-emitting device module of this configuration, since a larger number of second wires are provided compared with the light-emitting device module, it is possible to conduct the heat of the temperature control surface more to the light-emitting device. It is possible to absorb the heat of the light-emitting device more through the temperature control surface.

Another aspect of the invention is directed to an atomic oscillator including the light-emitting device module according to the aspect.

With the atomic oscillator according to this aspect, it is possible to irradiate light having high frequency accuracy on a gas cell. Therefore, it is possible to cause the atomic oscillator to stably operate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention are explained below with reference to the accompanying drawings.

1. Light-Emitting Device Module

Figure 1:
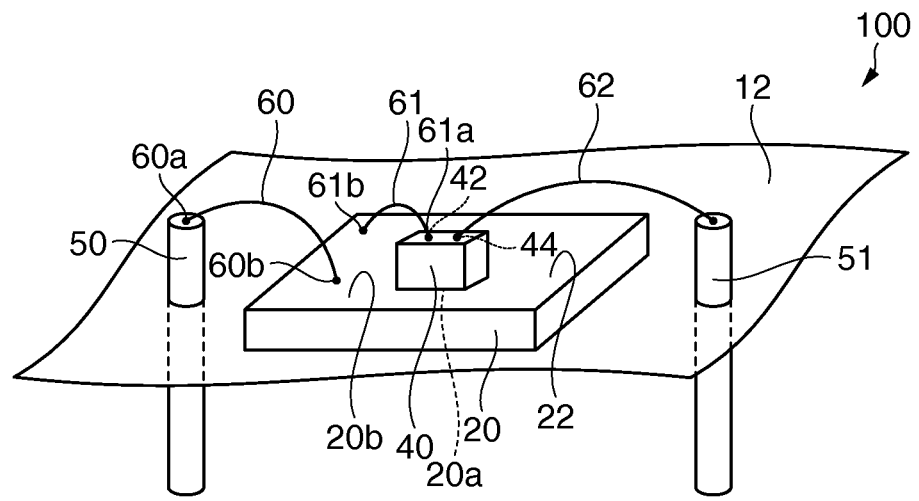
FIG. 1 is a perspective view schematically showing a light-emitting device module according to an embodiment.
Figure 2:
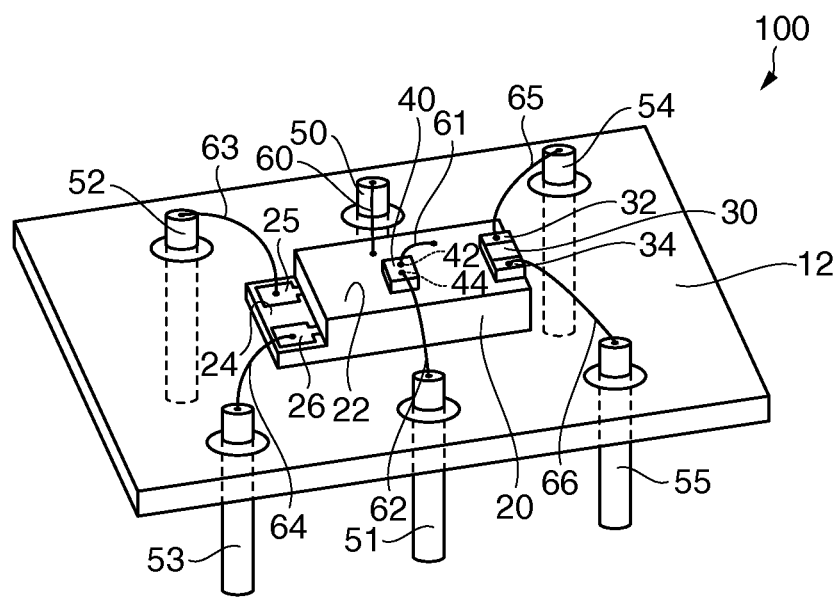
FIG. 2 is a perspective view schematically showing the light-emitting device module according to the embodiment.
Figure 3:
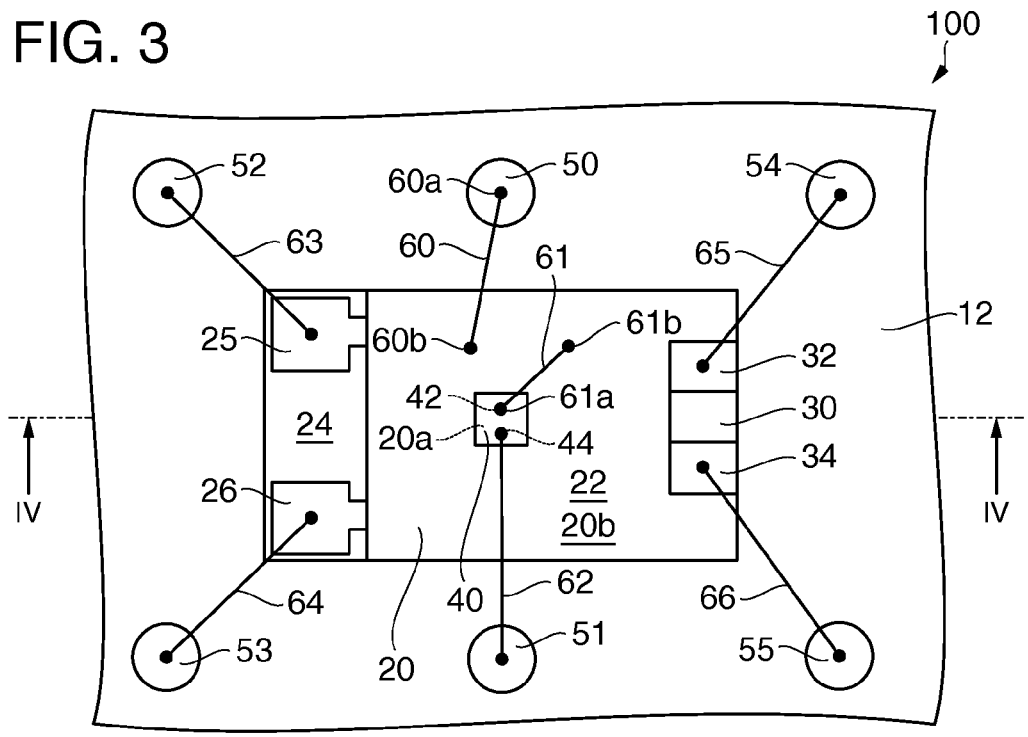
FIG. 3 is a plan view schematically showing the light-emitting device module according to the embodiment.
Figure 4:
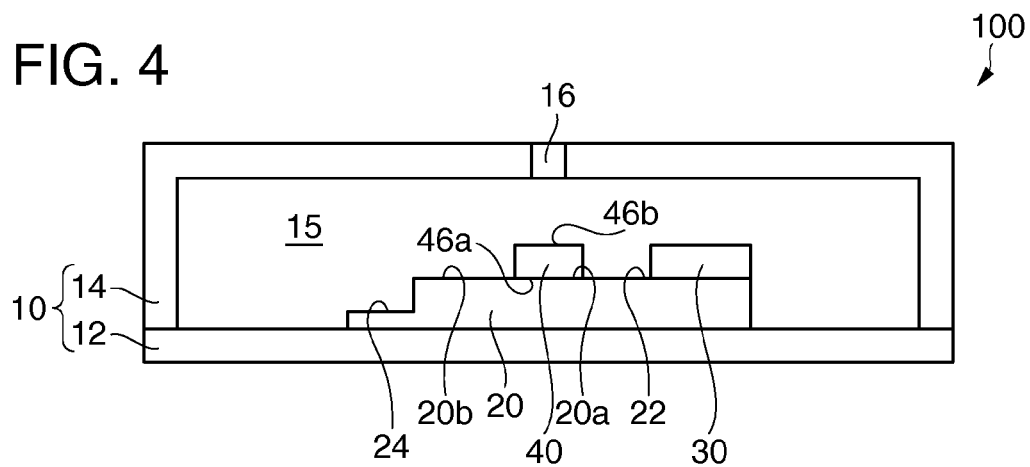
FIG. 4 is a sectional view schematically showing the light-emitting device module according to the embodiment.
Figure 5:
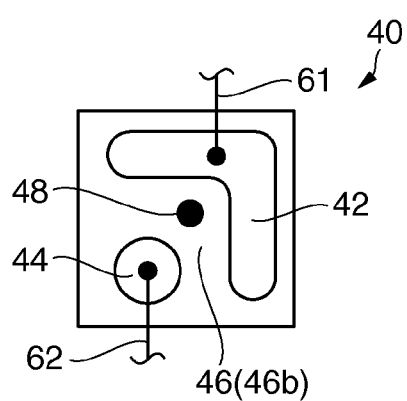
FIG. 5 is a plan view schematically showing a light-emitting device of the light-emitting device module according to the embodiment.

First, a light-emitting device module according to an embodiment is explained with reference to the drawings. FIG. 1 is a perspective view schematically showing a light-emitting device module 100 according to this embodiment. FIG. 2 is a perspective view schematically showing the light-emitting device module 100 according to this embodiment. FIG. 3 is a plan view schematically showing the light-emitting device module 100 according to this embodiment. FIG. 4 is a IV-IV line sectional view of FIG. 3 schematically showing the light-emitting device module 100 according to this embodiment. FIG. 5 is a plan view schematically showing a light-emitting device 40 of the light-emitting device module 100 according to this embodiment.

The light-emitting device module 100 can include, as shown in FIGS. 1 to 5, a package 10, a temperature variable device 20, a temperature sensor 30, the light-emitting device 40, and terminals 50 to 55.

For convenience, in FIG. 1, the configuration in the vicinity of the temperature variable device 20 is shown. The temperature variable device 20 is shown in a simplified form. In FIGS. 1 to 3, a lid 14 of the package 10 is not shown. The light-emitting device 40 is shown in a simplified form.

The package 10 can house, as shown in FIG. 4, the temperature variable device 20, the temperature sensor 30, and the light-emitting device 40. The shape of the package 10 is not specifically limited as long as the package 10 can house the temperature variable device 20, the temperature sensor 30, and the light-emitting device 40. Examples of the material of the package 10 include metal and ceramics.

In an example shown in FIG. 4, the package 10 includes a base 12 and the lid 14. The base 12 is, for example, a tabular member. The temperature variable device 20 is mounted on the base 12.

The lid 14 has a shape including a recess 15. The temperature variable device 20, the temperature sensor 30, and the light-emitting device 40 can be housed in the recess 15. The opening of the recess 15 is sealed by the base 12.

The lid 14 can include a light transmitting section 16. The light transmitting section 16 is arranged above the light-emitting device 40. Light emitted from the light-emitting device 40 is irradiated on the outside of the package 10 through the light transmitting section 16. The material of the light transmitting section 16 is not specifically limited as long as the light transmitting section 16 can transmit light emitted from the light-emitting device 40.

Although not shown in the figure, in the package 10, the base 12 has a shape including a recess and the lid 14 has a tabular shape. The recess of the base 12 may be sealed by the tabular lid 14 to house the temperature variable device 20, the temperature sensor 30, and the light-emitting device 40 in the package 10.

As shown in FIG. 2, the terminals 50 to 55 are provided in the base 12. More specifically, the terminals 50 to 55 extend from the inside to the outside of the package 10 piercing through the base 12. In an example shown in the figure, the terminals 50 to 55 are bar-like members. One ends of the terminals 50 to 55 are arranged on the inside of the package 10 and the other ends are arranged on the outside of the package 10. Wires are connected to the one ends of the terminals 50 to 55. A voltage is applied to the other ends of the terminals 50 to 55, whereby the voltage can be applied to the temperature variable device 20, the temperature sensor 30, and the light-emitting device 40 housed in the package 10. The material of the terminals 50 to 55 is not specifically limited as long as the material is electrically conductive.

The temperature variable device 20 is mounted on the base 12 via, for example, silver paste. The temperature variable device 20 includes a temperature control surface 22 including a surface (a mounting section) 20a on which the light-emitting device 40 is mounted. A plane shape of the temperature control surface 22 is not specifically limited. In an example shown in the figure, the plane shape is square (more specifically, rectangular). The temperature control surface 22 can have electrical conductivity. For example, the electrical conductivity may be imparted to the temperature control surface 22 (the temperature control surface 22 may be metalized) by growing a thin film of metal. At least one of heating and heat absorption can be applied by the temperature variable device 20 to the light-emitting device 40 via a surface (the mounting section 20a and a portion of the temperature control surface 22) on which the light-emitting device 40 is mounted.

In the example shown in the figure, a Peltier device is used as the temperature variable device 20. In the example shown in the figure, the temperature variable device 20 includes pads 25 and 26 formed on a pad forming surface 24. The pads 25 and 26 are respectively electrically connected to terminals 52 and 53 via wires 63 and 64. Consequently, it is possible to apply a voltage and feed an electric current to the temperature variable device 20 and cause the temperature control surface 22 to generate heat. It is possible to cause the temperature control surface 22 to absorb heat by inverting the polarity of the voltage applied to the temperature variable device 20. In this way, the temperature control surface 22 can be controlled to a desired temperature. The temperature variable device 20 can apply heating and heat absorption to the light-emitting device 40 mounted on the mounting section 20a of the temperature control surface 22 (the portion of the temperature control surface 22).

In the description related to the invention, the wording "electrically connected" is used in such a way as "another specific member (hereinafter referred to as "B member") "electrically connected" to a specific member (hereinafter referred to as "A member")". In the case of this example, the wording "electrically connected" is used to indicate both that the A member and the B member are joined (e.g., diffusion joining or metal joining by brazing, welding, or the like) and that the A member and the B member are electrically connected via another member.

The temperature sensor 30 is mounted on the temperature control surface 22 via, for example, silver paste. The temperature sensor 30 can detect the temperature of the temperature control surface 22. In the example shown in the figure, a thermistor is used as the temperature sensor 30. In the example shown in the figure, the temperature sensor 30 includes pads 32 and 34. The pads 32 and 34 are respectively electrically connected to the terminals 54 and 55 via wires 65 and 66. Consequently, it is possible to apply a voltage and feed an electric current to the temperature sensor 30. It is possible to detect the temperature of the temperature control surface 22 from a resistance value of the temperature sensor 30.

Figure 20:
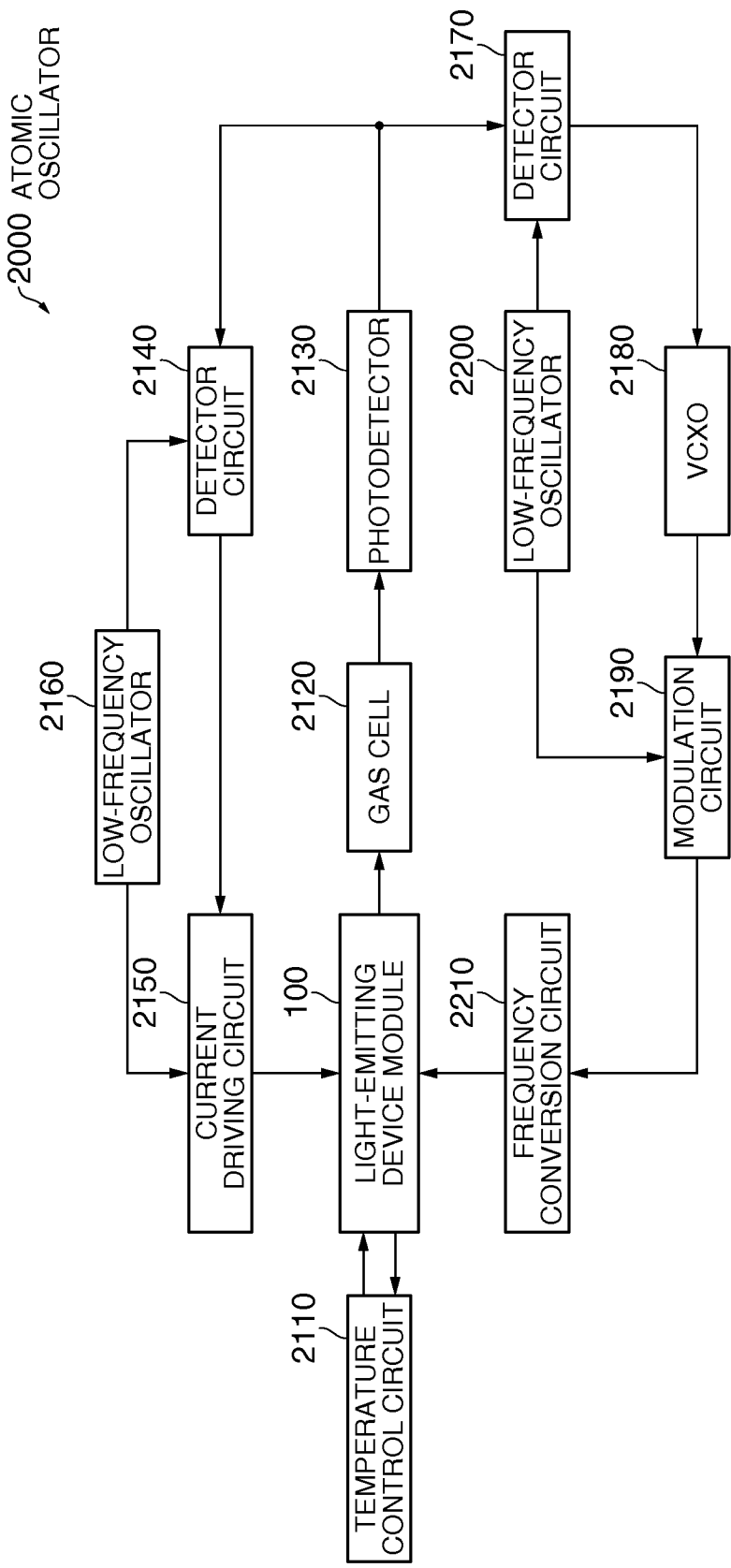
FIG. 20 is a diagram showing the configuration of an atomic oscillator according to an embodiment.

The temperature variable device 20 and the temperature sensor 30 may be electrically connected to a temperature control circuit (see FIG. 20). The temperature control circuit can control a current value fed to the temperature variable device 20 on the basis of the temperature detected by the temperature sensor 30.

The light-emitting device 40 is mounted on the mounting section 20a of the temperature control surface 22 via, for example, silver paste. The light-emitting device 40 can emit light. As the light-emitting device 40, for example, a vertical cavity surface emitting laser (VCSEL) or an edge emitting laser can be used. The vertical cavity surface emitting laser has a small threshold current compared with the edge emitting laser. Therefore, power consumption can be reduced. The vertical cavity surface emitting laser can be particularly suitably used as the light-emitting device 40. In an example explained below, the vertical cavity surface emitting laser is used as the light-emitting device 40.

The light-emitting device 40 can include, as shown in FIG. 5, a first electrode 42, a second electrode 44, and a semiconductor layer 46. The semiconductor layer 46 includes, as shown in FIG. 4, a first surface 46a and a second surface 46b that face directions opposite to each other. The first surface 46a is a surface (a mounting surface) on a side mounted on the temperature variable device 20. The light-emitting device 40 is mounted on the temperature control surface 22 such that the first surface 46a faces the temperature control surface 22 side. The second surface 46b is arranged to be opposed to the light transmitting section 16. As shown in FIG. 5, the first electrode 42 and the second electrode 44 are formed on the second surface 46b side of the semiconductor layer 46. The first electrode 42 may be a cathode and the second electrode 44 may be an anode. Examples of the material of the first electrode 42 and the second electrode 44 include gold, germanium, platinum, and alloys of these metals.

Although not shown in the figure, the semiconductor layer 46 has structure in which an active layer and a first mirror layer and a second mirror layer, which sandwich the active layer, are laminated. When a voltage is applied to the first electrode 42 and the second electrode 44, recombination of electrons and holes occurs in the active layer to cause light emission. The light generated in the active layer travels back and forth between the first mirror layer and the second mirror layer, whereby laser oscillation occurs. The light-emitting device 40 can emit light from an emitting section 48. As the active layer, the first mirror layer, and the second mirror layer, for example, a GaAs layer or an AlGaAs layer can be used.

In an example shown in FIG. 5, the emitting section 48 is provided on the second surface 46b side. However, the emitting section 48 may be provided on the first surface 46a side. In this case, the temperature variable device 20 and the base 12 of the package 10 can include light transmitting sections that transmit light emitted from the emitting section 48. Consequently, the light-emitting device 40 can emit the light from the first surface 46a side.

The first electrode 42 is electrically connected to the first terminal 50. The first terminal 50 is a terminal for supplying electric power to the first electrode 42. In an example shown in FIG. 1, the first electrode 42 is electrically connected to the first terminal 50 via a first wire 60 and a second wire 61. One end 60a of the first wire 60 is joined to the first terminal 50. The other end 60b of the first wire 60 is thermally connected to a portion 20b of the temperature control surface 22 other than the mounting section 20a (the other portion of the temperature control surface 22). In the example shown in FIG. 1, the other end 60b of the first wire 60 is joined (directly connected) to the other portion 20b of the temperature control surface 22.

In the description related to the invention, the wording "thermally connected" is used to indicate both that the wire and the temperature control surface are joined (e.g., diffusion joining or metal joining by brazing, welding, or the like) and that a member conforming to the temperature of the temperature control surface is arranged between the wire and the temperature control surface and the member is in contact with the wire. The member conforming to the temperature of the temperature control surface is a member having thermal conductivity that can conduct the heat of the temperature control surface to the wire and conduct the heat of the wire to the temperature control surface.

One end 61a of the second wire 61 is joined to the first electrode 42. The other end 61b of the second wire 61 is thermally connected to the other portion 20b of the temperature control surface 22. In the example shown in the figure, the other end 61b of the second wire 61 is joined to the temperature control surface 22. The other end 60b of the first wire 60 and the other end 61b of the second wire 61 are electrically connected by the temperature control surface 22 having electrical conductivity. In other words, the first terminal 50 and the first electrode 42 conduct via the temperature control surface 22. The wires 60 and 61 and the temperature control surface 22 can form a wire that causes the first terminal 50 and the first electrode 42 to conduct. In the example shown in the figure, the other end 60b of the first wire 60 and the other end 61b of the second wire 61 are spaced apart.

Although not shown in the figure, the other end 60b of the first wire 60 and the other end 61b of the second wire 61 may be joined to or in contact with each other. The first wire 60 and the second wire 61 may be integrally formed as long as a portion of the wires are joined to or in contact with the temperature control surface 22.

The second electrode 44 is electrically connected to the second terminal 51. In the example shown in the figure, the second electrode 44 is electrically connected to the second terminal 51 via the wire 62. The second terminal 51 is a terminal for supplying electric power to the second electrode 44.

The material of the wires 60 to 66 is not specifically limited as long as the material is electrically conductive. Examples of the material include gold, copper, and aluminum.

The light-emitting device module 100 according to this embodiment has, for example, characteristics explained below.

In the light-emitting device module 100, the first electrode 42 and the first terminal 50 are electrically connected via the first wire 60. The one end 60a of the first wire 60 is joined to the first terminal 50. The other end 60b of the first wire 60 is thermally connected (in the example shown in the figure, joined) to the temperature control surface 22. In other words, in the light-emitting device module 100, the first electrode 42 and the first terminal 50 are electrically connected via the temperature control surface 22 controlled to the predetermined temperature. Therefore, in the light-emitting device module 100, it is possible to suppress the temperature of the light-emitting device 40 from deviating from a desired temperature.

For example, if the first terminal and the first electrode are electrically connected by the first wire not via the temperature control surface (i.e., one end of the first wire is joined to the first terminal and the other end of the first wire is joined to the first electrode), in some case, the light-emitting device is affected by temperature outside the package (outdoor temperature) through the first terminal and the first wire and the temperature of the light-emitting device fluctuates. More specifically, when the outdoor temperature is lower than the temperature of the temperature control surface, the heat of the light-emitting device heated by the temperature control surface to temperature same as (or close to) the temperature of the temperature control surface is radiated through the first wire and the first terminal. Conversely, when the outdoor temperature is higher than the temperature of the temperature control surface, heat flows into the semiconductor device through the first wire and the first terminal. Therefore, in such a form, the temperature of the light-emitting device deviates from the desired temperature.

In the light-emitting device module 100 according to the embodiment of the invention, it is possible to solve the problem and suppress a temperature fluctuation of the light-emitting device 40.

In the light-emitting device module 100, the one end 61a of the second wire 61 is joined to the first electrode 42. The other end 61b of the second wire 61 is thermally connected (in the example shown in the figure, joined) to the temperature control surface 22 controlled to the desired temperature. Therefore, it is possible to apply heating and heat absorption to the light-emitting device 40 via the second wire 61 and suppress the temperature of the light-emitting device 40 from deviating from the desired temperature.

With the light-emitting device module 100, at least the material of the wires 60 and 62 can be aluminum. Aluminum has small thermal conductivity compared with gold and copper. Therefore, in the light-emitting device module 100, it is possible to prevent the light-emitting device 40 from being affected by the temperature on the outside of the package 10 via the wires 60 and 62.

2. Modifications of the Light-Emitting Device Module 2.1. First Modification

Figure 6:
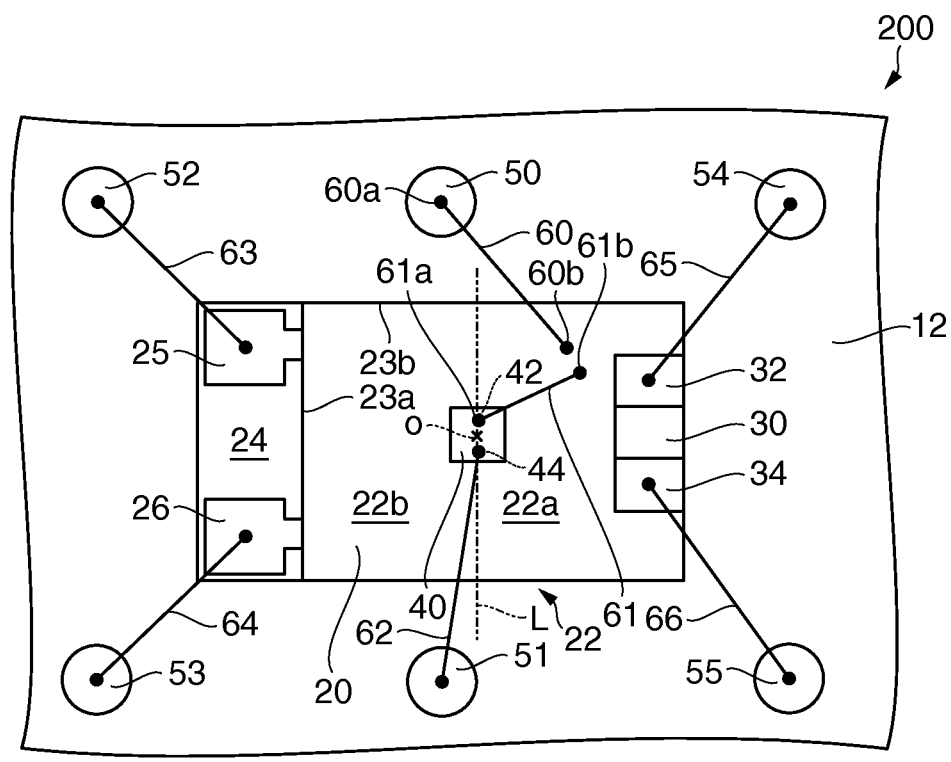
FIG. 6 is a plan view schematically showing a light-emitting device module according to a first modification of the embodiment.

A light-emitting device module according to a first modification of this embodiment is explained with reference to the drawings. FIG. 6 is a plan view schematically showing a light-emitting device module 200 according to the first modification of this embodiment. FIG. 6 corresponds to FIG. 3.

In the following explanation, in the light-emitting device module 200 according to the first modification of this embodiment, members having functions same as the functions of the members of the light-emitting device module 100 according to this embodiment are denoted by the same reference numerals and signs. Detailed explanation of the members is omitted.

In the light-emitting device module 200, as shown in FIG. 6, the light-emitting device 40 is arranged on an imaginary straight line L in plan view. The imaginary straight line L is a straight line passing a center O of the temperature control surface 22 having a square (in an example shown in the figure, rectangular) shape. In the example shown in the figure, the imaginary straight line L is a straight line parallel to a short side 23a of the temperature control surface 22. However, the imaginary straight line L may be a straight line parallel to a long side 23b of the temperature control surface 22. The temperature control surface 22 is divided into a first region 22a and a second region 22b by the imaginary straight line L.

The temperature sensor 30 is arranged in the first region 22a. The other end 60b of the first wire 60 and the other end 61b of the second wire 61 are joined to the first region 22a. In other words, all of the temperature sensor 30, the other end 60b of the first wire 60, and the other end 61b of the second wire 61 are arranged in the first region 22a. In the example shown in the figure, a region close to the pad forming surface 24 is the second region 22b and a region far from the pad forming surface 24 is the first region 22a. However, the region close to the pad forming surface 24 may be the first region 22a and the region far from the pad forming surface 24 may be the second region 22b.

When the temperature detected by the temperature sensor 30 changes, for example, the current value fed to the temperature variable device 20 can be changed and the temperature of the temperature control surface 22 can be controlled to the desired temperature by the temperature control circuit. Therefore, even if the temperature of the temperature control surface 22 fluctuates due to being affected by the temperature on the outside of the package 10 through the first terminal 50 and the first wire 60, since the other end 60b of the first wire 60 is arranged in the first region 22a where the temperature sensor 30 is arranged, the temperature sensor 30 quickly detects the temperature change. Therefore, it is possible to change the current value fed to the temperature variable device 20.

Further, since the temperature sensor 30 is mounted on the first region 22a, the temperature of the first region 22a is more surely controlled to the desired temperature compared with the second region 22b. Therefore, it is possible to more surely bring the temperature of the light-emitting device 40 close to the temperature of the temperature control surface 22 through the second wire 61.

As explained above, in the light-emitting device module 200, it is possible to more surely suppress the temperature of the light-emitting device 40 from deviating from the desired temperature.

2.2 Second Modification

Figure 7:
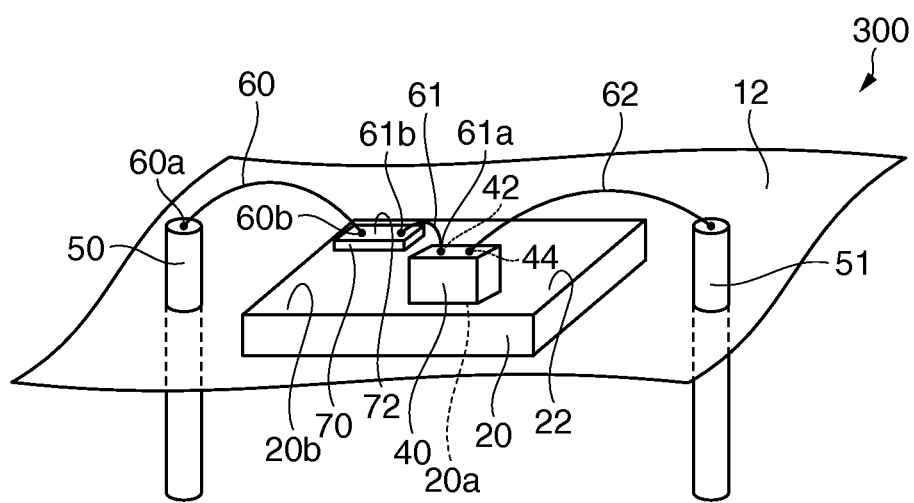
FIG. 7 is a perspective view schematically showing a light-emitting device module according to a second modification of the embodiment.
Figure 8:
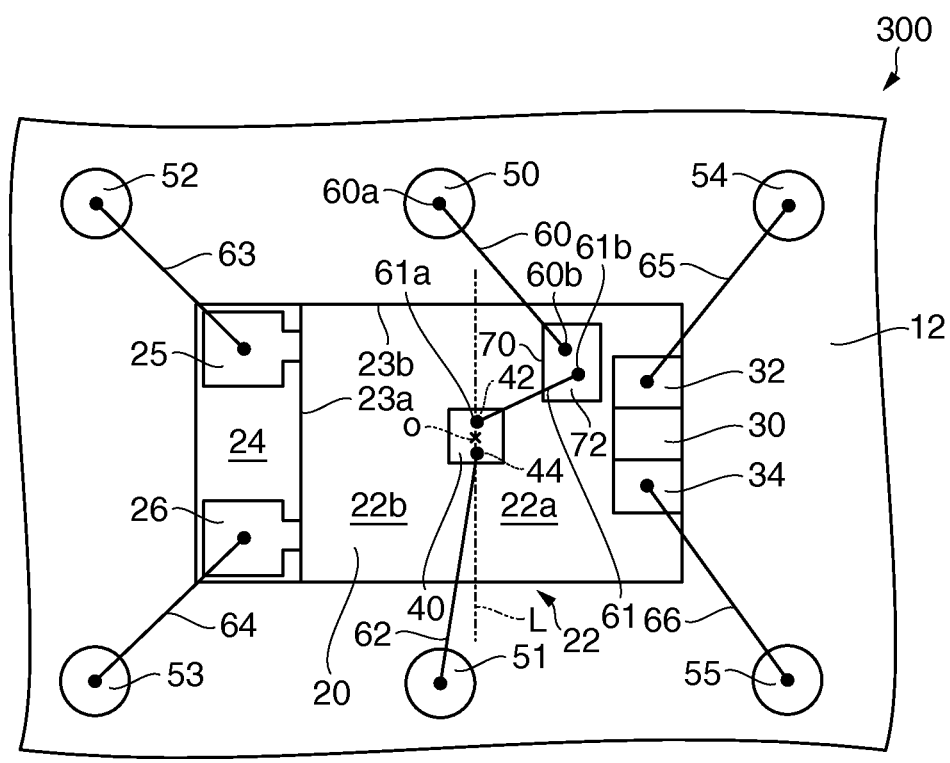
FIG. 8 is a plan view schematically showing the light-emitting device module according to the second modification of the embodiment.

A light-emitting device module according to a second modification of this embodiment is explained with reference to the drawings. FIG. 7 is a perspective view schematically showing a light-emitting device module 300 according to the second modification of this embodiment. FIG. 7 corresponds to FIG. 1. FIG. 8 is a plan view schematically showing the light-emitting device module 300 according to the second modification of this embodiment. FIG. 8 corresponds to FIG. 6.

In the following explanation, in the light-emitting device module 300 according to the second modification of this embodiment, members having functions same as the functions of the members of the light-emitting device module 100 according to this embodiment or the members of the light-emitting device module 200 according to the second modification of this embodiment are denoted by the same reference numerals and signs. Detailed explanation of the members is omitted.

In the example of the light-emitting device module 100, as shown in FIG. 1, the other end 60b of the first wire 60 and the other end 61b of the second wire 61 are joined to the temperature control surface 22 having electrical conductivity. On the other hand, in the light-emitting device module 300, as shown in FIGS. 7 and 8, the other end 60b of the first wire 60 and the other end 61b of the second wire 61 are joined to the first pad 72 formed on a first insulating member 70.

The first insulating member 70 is mounted on the other portion 20b of the temperature control surface 22 via, for example, silver paste. The first insulating member 70 may have a tabular shape. A first pad 72 is formed on the first insulating member 70 (on the surface of the first insulating member 70). The first insulating member 70 has thermal conductivity and can conduct the heat of the temperature control surface 22 to the first wire 60 and the second wire 61. Further, the first insulating member 70 can conduct the heat of the first wire 60 and the second wire 61 to the temperature control surface 22. Similarly, the first pad 72 has thermal conductivity. In other words, the other end 60b of the first wire 60 and the other end 61b of the second wire 61 are thermally connected to the temperature control surface 22 via the first pad 72 and the first insulating member 70.

Examples of the material of the first insulating member 70 include ceramics and alumina having thermal conductivity. The material of the first pad 72 is not specifically limited as long as the material has thermal conductivity and electrical conductivity.

With the light-emitting device module 300, even if the temperature control surface 22 does not have electrical conductivity, it is possible to thermally connect the other end 60b of the first wire 60 and the other end 61b of the second wire 61 to the temperature control surface 22 while electrically connecting the ends. In other words, the wires 60 and 61 and the first pad 72 can form a wire that causes the first terminal 50 and the first electrode 42 to conduct.

In the light-emitting device module 300, as shown in FIG. 8, the first insulating member 70 may be mounted on the first region 22a. Consequently, as explained above, it is possible to more surely suppress the temperature of the light-emitting device 40 from deviating from the desired temperature.

2.3. Third Modification

Figure 9:
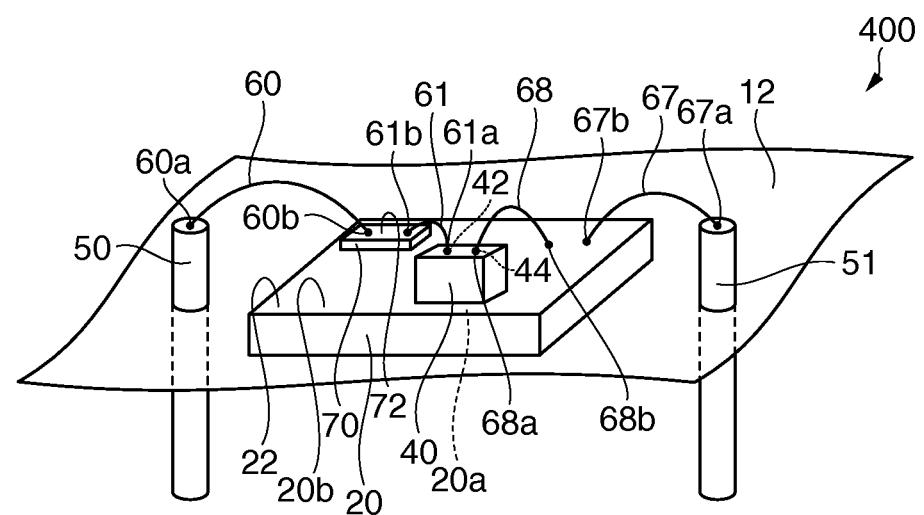
FIG. 9 is a perspective view schematically showing a light-emitting device module according to a third modification of the embodiment.

A light-emitting device module according to a third modification of this embodiment is explained with reference to the drawings. FIG. 9 is a perspective view schematically showing a light-emitting device module 400 according to the third modification of this embodiment. FIG. 9 corresponds to FIG. 7.

In the following explanation, in the light-emitting device module 400 according to the third modification of this embodiment, members having functions same as the functions of the members of the light-emitting device module 300 according to the second modification of this embodiment are denoted by the same reference numerals and signs. Detailed explanation of the members is omitted.

In the example of the light-emitting device module 300, as shown in FIG. 7, the second electrode 44 and the second terminal 51 are electrically connected via the wire 62. On the other hand, in the light-emitting device module 400, as shown in FIG. 9, the second electrode 44 and the second terminal 51 are electrically connected via a third wire 67 and a fourth wire 68.

One end 67a of the third wire 67 is joined to the second terminal 51. The other end 67b of the third wire 67 is joined to the other portion 20b of the temperature control surface 22. One end 68a of the fourth wire 68 is joined to the second electrode 44. The other end 68b of the fourth wire 68 is joined to the other portion 20b of the temperature control surface 22. The other end 60b of the first wire 60 and the other end 61b of the second wire 61 are electrically connected by the temperature control surface 22 having electrical conductivity. For example, the other end 67b of the third wire 67 and the other end 68b of the fourth wire 68 are spaced apart.

Although not shown in the figure, the other end 67b of the third wire 67 and the other end 68b of the fourth wire 68 may be joined to or in contact with each other. The third wire 67 and the fourth wire 68 may be integrally formed as long as a portion of the wires are joined to or in contact with the temperature control surface 22.

The material of the wires 67 and 68 is not specifically limited as long as the material is electrically conductive. Examples of the material include gold, copper, and aluminum.

In the light-emitting device module 400, the second electrode 44 and the second terminal 51 are electrically connected via the temperature control surface 22 controlled to the predetermined temperature. Therefore, in the light-emitting device module 400, compared with, for example, the light-emitting device module 300, it is possible to more surely suppress the temperature of the light-emitting device 40 from deviating from a desired temperature.

Although not shown in the figure, the other end 67b of the third wire 67 and the other end 68b of the fourth wire 68 may be joined to the first region 22a (see FIG. 8) on which the temperature sensor 30 is mounted.

2.4. Fourth Modification

Figure 10:
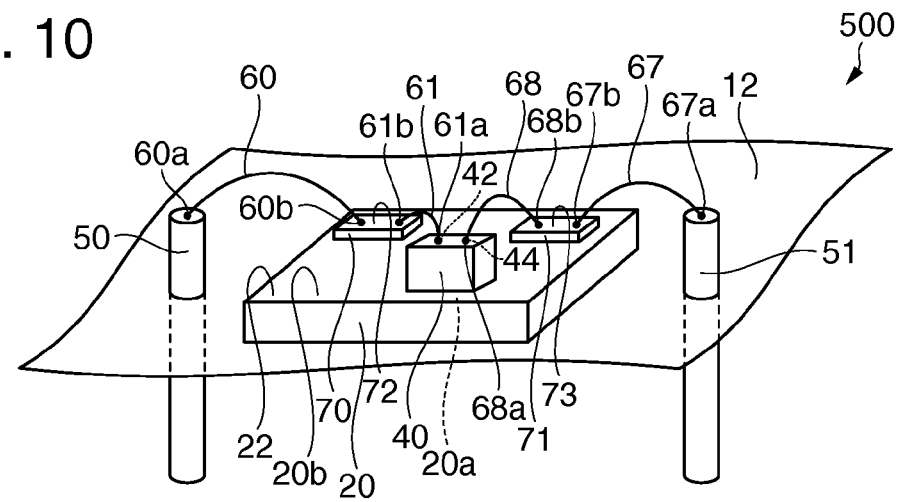
FIG. 10 is a perspective view schematically showing a light-emitting device module according to a fourth modification of the embodiment.

A light-emitting device module according to a fourth modification of this embodiment is explained with reference to the drawings. FIG. 10 is a perspective view schematically showing a light-emitting device module 500 according to the fourth modification of this embodiment. FIG. 10 corresponds to FIG. 9.

In the following explanation, in the light-emitting device module 500 according to the fourth modification of this embodiment, members having functions same as the functions of the members of the light-emitting device module 400 according to the third modification of this embodiment are denoted by the same reference numerals and signs. Detailed explanation of the members is omitted.

In the example of the light-emitting device module 400, as shown in FIG. 9, the other end 67b of the third wire 67 and the other end 68b of the fourth wire 68 are joined to the temperature control surface 22 having electrical conductivity. On the other hand, in the light-emitting device module 500, as shown in FIG. 10, the other end 67b of the third wire 67 and the other end 68b of the fourth wire 68 are joined to a second pad 73 formed on a second insulting member 71.

The second insulating member 71 is mounted on the other portion 20b of the temperature control surface 22 via, for example, silver paste. The second insulating member 71 may have a tabular shape. The second pad 73 is formed on the second insulating member 71 (on the surface of the second insulating member 71). The second insulating member 71 has thermal conductivity and can conduct the heat of the temperature control surface 22 to the third wire 67 and the fourth wire 68. Further, the second insulating member 71 can conduct the heat of the third wire 67 and the fourth wire 68 to temperature control surface 22. Similarly, the second pad 73 has thermal conductivity. In other words, the other end 67b of the third wire 67 and the other end 68b of the fourth wire 68 are thermally connected to the temperature control surface 22 via the second pad 73 and the second insulating member 71.

Examples of the material of the second insulating member 71 include ceramics and alumina having thermal conductivity. The material of the second pad 73 is not specifically limited as long as the material has thermal conductivity and electrical conductivity.

With the light-emitting device module 500, even if the temperature control surface 22 does not have electrical conductivity, it is possible to thermally connect the other end 67b of the third wire 67 and the other end 68b of the fourth wire 68 while electrically connecting the ends.

Although not shown in the figure, the second insulating member 71 may be mounted on the first region 22a (see FIG. 8) on which the temperature sensor 30 is mounted.

2.5. Fifth Modification

Figure 11:
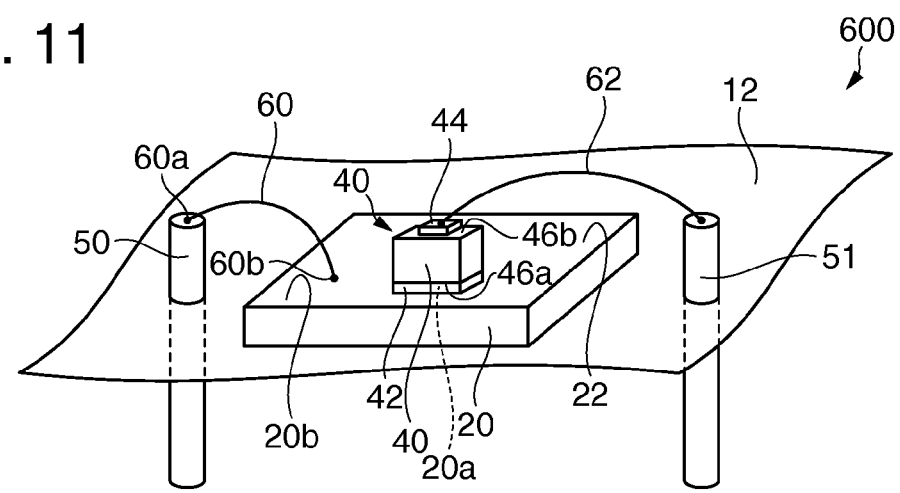
FIG. 11 is a perspective view schematically showing a light-emitting device module according to a fifth modification of the embodiment.

A light-emitting device module according to a fifth modification of this embodiment is explained below the reference to the drawings. FIG. 11 is a perspective view schematically showing a light-emitting device module 600 according to the fifth modification of this embodiment. FIG. 11 corresponds to FIG. 1.

In the following explanation, in the light-emitting device module 600 according to the fifth modification of this embodiment, members having functions same as the functions of the members of the light-emitting device module 100 according to this embodiment are denoted by the same reference numerals and signs. Detailed explanation of the members is omitted. The same applies to a light-emitting device module 700 according to a sixth modification, a light-emitting device module 800 according to a seventh modification, a light-emitting device module 900 according to an eighth modification, and a light-emitting device module 1000 according to a ninth modification explained below.

In the example of the light-emitting device module 100, as shown in FIGS. 1 and 5, the first electrode 42 and the second electrode 44 are formed on the second surface 46b side of the semiconductor layer 46. On the other hand, in the light-emitting device module 600, as shown in FIG. 11, the first electrode 42 is formed on the first surface 46a side of the semiconductor layer 46 and the second electrode 44 is formed on the second surface 46b side of the semiconductor layer 46. In other words, in the light-emitting device 40 of the light-emitting device module 600, the semiconductor layer 46 is sandwiched by the first electrode 42 and the second electrode 44. The first electrode 42 is joined to the mounting section 20a of the temperature control surface 22.

In the light-emitting device module 600, it is possible to electrically connect the first terminal 50 to the first electrode 42 via the first wire 60 and the conductive temperature control surface 22 without using the second wire 61 (see FIG. 1). In other words, the first wire 60 and the temperature control surface 22 can form a wire that causes the first terminal 50 and the first electrode 42 to conduct.

Figure 12:
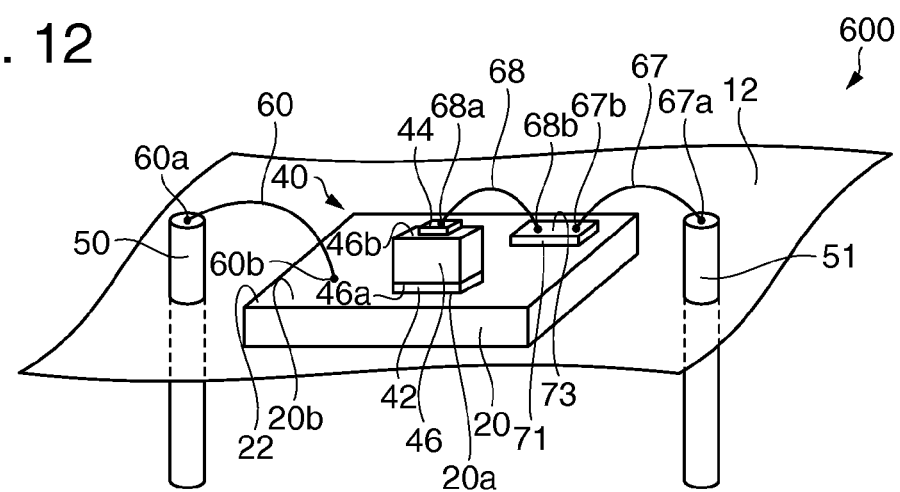
FIG. 12 is a perspective view schematically showing the light-emitting device module according to the fifth modification of the embodiment.

In the light-emitting device module 600, as shown in FIG. 12, the second electrode 44 and the second terminal 51 may be electrically connected by the third wire 67 and the fourth wire 68. The other end 67b of the third wire 67 and the other end 68b of the fourth wire 68 may be joined to the second pad 73. The second pad 73 may be formed on the second insulating member 71 mounted on the temperature control surface 22. The explanation concerning the light-emitting device module 500 according to the fourth modification can be applied to the third wire 67, the fourth wire 68, the second pad 73, and the second insulating member 71.

2.6. Sixth Modification

Figure 13:
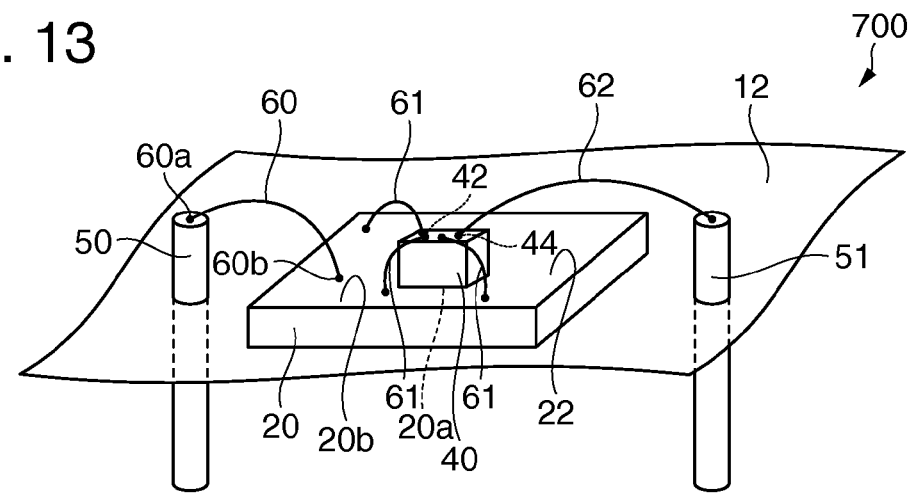
FIG. 13 is a perspective view schematically showing a light-emitting device module according to a sixth modification of the embodiment.
Figure 14:
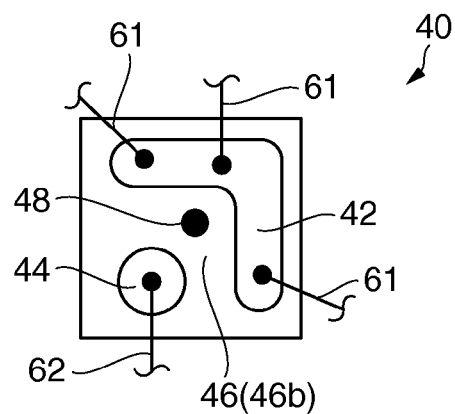
FIG. 14 is a plan view schematically showing a light-emitting device of the light-emitting device module according to the sixth modification of the embodiment.

A light-emitting device module according to a sixth modification of this embodiment is explained with reference to the drawings. FIG. 13 is a perspective view schematically showing a light-emitting device module 700 according to the sixth modification of this embodiment. FIG. 13 corresponds to FIG. 1. FIG. 14 is a plan view schematically showing the light-emitting device 40 of the light-emitting device module 700 according to the sixth modification of this embodiment. FIG. 14 corresponds to FIG. 5.

In the example of the light-emitting device module 100, as shown in FIGS. 1 and 5, the light-emitting device module 100 includes one second wire 61. On the other hand, in an example of the light-emitting device module 700, as shown in FIGS. 13 and 14, the light-emitting device module 700 includes a plurality of second wires 61. In the example shown in the figures, three second wires 61 are provided. However, the number of second wires 61 is not specifically limited. Although not shown in the figures, a plurality of wires 62 may be provided.

With the light-emitting device module 700, since a larger number of second wires 61 are provided compared with the light-emitting device module 100, it is possible to conduct the heat of the temperature control surface 22 more to the light-emitting device 40. Alternatively, it is possible to absorb the heat of the light-emitting device 40 more through the temperature control surface 22. Consequently, the light-emitting device module 700 can more surely suppress the temperature of the light-emitting device 40 from deviating from the desired temperature.

Figure 15:
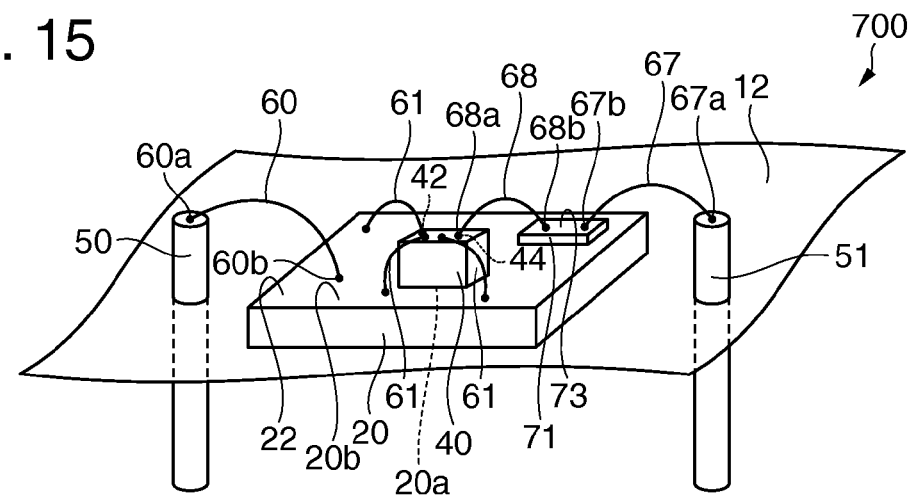
FIG. 15 is a perspective view schematically showing the light-emitting device module according to the sixth modification of the embodiment.

In the light-emitting device module 700, as shown in FIG. 15, the second electrode 44 and the second terminal 51 may be electrically connected by the third wire 67 and the fourth wire 68. The other end 67b of the third wire 67 and the other end 68b of the fourth wire 68 may be joined to the second pad 73. The second pad 73 may be formed on the second insulating member 71 mounted on the temperature control surface 22. The explanation concerning the light-emitting device module 500 according to the fourth modification can be applied to the third wire 67, the fourth wire 68, the second pad 73, and the second insulating member 71.

2.7. Seventh Modification

Figure 16:
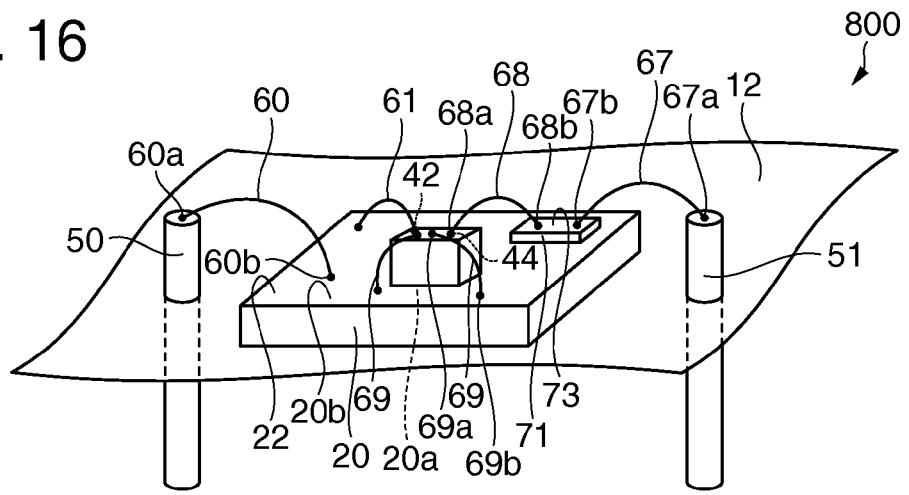
FIG. 16 is a perspective view schematically showing a light-emitting device module according to a seventh modification of the embodiment.
Figure 17:
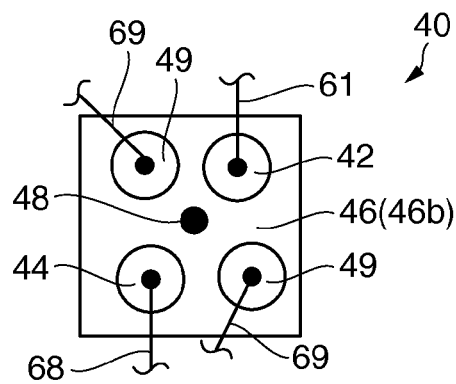
FIG. 17 is a plan view schematically showing a light-emitting device of the light-emitting device module according to the seventh modification of the embodiment.

A light-emitting device module according to a seventh modification of this embodiment is explained with reference to the drawings. FIG. 16 is a perspective view schematically showing a light-emitting device module 800 according to the seventh modification of this embodiment. FIG. 16 corresponds to FIG. 1. FIG. 17 is a plan view schematically showing the light-emitting device 40 of the light-emitting device module 800 according to the seventh modification of this embodiment. FIG. 17 corresponds to FIG. 5.

In the light-emitting device module 800, as shown in FIG. 17, the light-emitting device 40 includes dummy electrodes 49. The dummy electrodes 49 are formed on the second surface 46b side of the semiconductor layer 46. In an example shown in the figure, two dummy electrodes 49 are provided. However, the number of dummy electrodes 49 is not specifically limited. The dummy electrodes 49 are spaced apart from the first electrode 42 and the second electrode 44 and electrically separated from the first electrode 42 and the second electrode 44.

In the light-emitting device module 800, as shown in FIGS. 16 and 17, fifth wires 69 are provided. A plurality of fifth wires 69 may be provided to correspond to the number of dummy electrodes 49. One ends 69a of the fifth wires 69 are joined to the dummy electrodes 49. The other ends 69b of the fifth wires 69 are joined to the temperature control surface 22.

The material of the fifth wires 69 is not specifically limited as long as the material is electrically conductive. Examples of the material include gold, copper, and aluminum.

With the light-emitting device module 800, for example, even when the area of the first electrode 42 cannot be increased and the number of second wires 61 cannot be increased, it is possible to conduct the heat of the temperature control surface 22 to the light-emitting device 40 via the fifth wires 69. It is also possible to absorb the heat of the light-emitting device 40 via the fifth wires 69.

2.8. Eighth Modification

Figure 18:
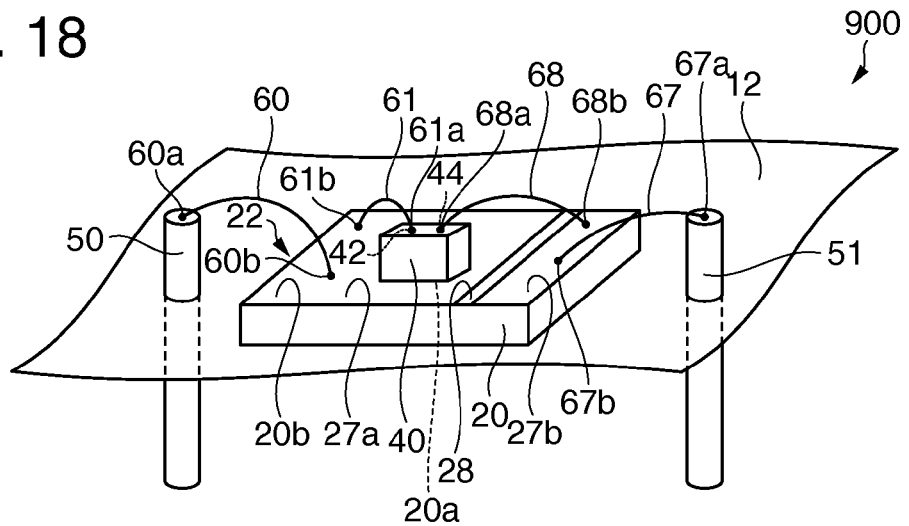
FIG. 18 is a perspective view schematically showing a light-emitting device module according to an eighth modification of the embodiment.

A light-emitting device module according to an eighth modification of this embodiment is explained with reference to the drawings. FIG. 18 is a perspective view schematically showing a light-emitting device module 900 according to the eighth modification of this embodiment. FIG. 18 corresponds to FIG. 1.

In the light-emitting device module 900, as shown in FIG. 18, the temperature control surface 22 includes a first portion 27a and a second portion 27b electrically separated from the first portion 27a. For example, as shown in FIG. 18, the first portion 27a and the second portion 27b may be electrically separated by selectively metalizing the first portion 27a and the second portion 27b via an insulated portion 28. Further, the first portion 27a and the second portion 27b may be electrically separated by forming a groove (not shown in the figure) on the temperature control surface 22 having electrical conductivity.

The first electrode 42 and the first terminal 50 are electrically connected via the first wire 60 and the second wire 61. The one end 60a of the first wire 60 is joined to the first terminal 50. The other end 60b of the first wire 60 is joined to the first portion 27a. The one end 61a of the second wire 61 is joined to the first electrode 42. The other end 61b of the second wire 61 is joined to the first portion 27a. The other end 60b of the first wire 60 and the other end 61b of the second wire 61 are electrically connected by the first portion 27a having electrical conductivity.

The second electrode 44 and the second terminal 51 are electrically connected via the third wire 67 and the fourth wire 68. The one end 67a of the third wire 67 is joined to the second terminal 51. The other end 67b of the third wire 67 is joined to the second portion 27b. The one end 68a of the fourth wire 68 is joined to the second electrode 44. The other end 68b of the fourth wire 68 is joined to the second portion 27b. The other end 67b of the third wire 67 and the other end 68b of the fourth wire 68 are electrically connected by the second portion 27b having electrical conductivity.

In an example shown in the figure, the light-emitting device 40 is mounted on the first portion 27a. However, the light-emitting device 40 may be mounted on the second portion 27b.

With the light-emitting device module 900, it is possible to conduct the heat of the temperature control surface 22 to the first electrode 42 and the second electrode 44 without arranging an insulating member on the temperature control surface 22 and without causing a short circuit of the first terminal 50 and the second terminal 51. Further, it is possible to absorb the heat of the light-emitting device 40 from the first electrode 42 and the second electrode 44.

2.9. Ninth Modification

Figure 19:
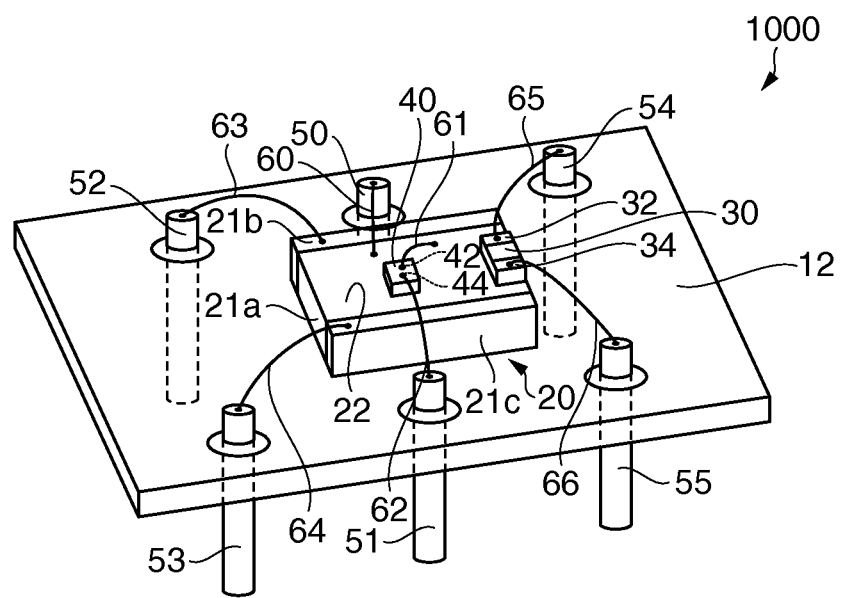
FIG. 19 is a perspective view schematically showing a light-emitting device module according to a ninth modification of the embodiment.

A light-emitting device module according to a ninth embodiment of this embodiment is explained with reference to the drawings. FIG. 19 is a perspective view schematically showing a light-emitting device module 1000 according to the ninth modification of this embodiment. FIG. 19 corresponds to FIG. 2.

In the light-emitting device module 100, the Peltier device is used as the temperature variable device 20. On the other hand, in the light-emitting device module 1000, as shown in FIG. 19, a heater is used as the temperature variable device 20.

The temperature variable device 20 can include a resistance section 21*a* and conductive sections 21*b* and 21*c* that sandwich the resistance section 21*a*. The conductive section 21*b* is electrically connected to the terminal 52 via the wire 63. The conductive section 21*c* is electrically connected to the terminal 53 via the wire 64. Consequently, it is possible to apply a voltage to the resistance section 21*a* and cause the resistance section 21*a* to generate heat. The resistance section 21*a* includes the temperature control surface 22. The light-emitting device 40 is mounted on the temperature control surface 22. Therefore, it is possible to heat the light-emitting device 40 by causing the resistance section 21*a* to generate heat. The light-emitting device module 1000 can be suitably used, in particular, when the temperature of the outside of the package 10 is low.

3. Atomic Oscillator

An atomic oscillator according to an embodiment is explained with reference to the drawings. FIG. 20 is a diagram showing a configuration example of an atomic oscillator 2000 according to this embodiment.

The atomic oscillator 2000 includes the light-emitting device module according to this embodiment (in the example shown in the figure, the light-emitting device module 100), a temperature control circuit 2110, a gas cell 2120, a photodetector 2130, a detector circuit 2140, a current driving circuit 2150, a low-frequency oscillator 2160, a detector circuit 2170, a voltage controlled crystal oscillator 2180, a modulation circuit 2190, a low-frequency oscillator 2200, and a frequency conversion circuit 2210.

The temperature control circuit 2110 can control, on the basis of temperature detected by the temperature sensor 30 of the light-emitting device module 100, a current value fed to the temperature variable device 20 of the light-emitting device module 100. Consequently, the temperature control surface 22 of the light-emitting device module 100 is subjected to temperature control.

The gas cell 2120 is obtained by encapsulating gaseous alkali metal atoms in a container.

The light-emitting device 40 of the light-emitting device module 100 generates a plurality of lights having different frequencies and irradiates the lights on the gas cell 2120. Specifically, a center wavelength $\lambda_0$ (a center frequency is $f_0$) of the emitted lights of the light-emitting device 40 is controlled by a driving current output by the current driving circuit 2150. The light-emitting device 40 is modulated using an output signal of the frequency conversion circuit 2210 as a modulation signal. Specifically, the light-emitting device 40 generates modulated light by superimposing the output signal (the modulation signal) of the frequency conversion circuit 2210 on the driving current output by the current driving circuit 2150.

The photodetector 2130 detects light transmitted through the gas cell 2120 and outputs a detection signal corresponding to the intensity of the light. When two kinds of light coinciding with frequencies, a frequency difference of which is equivalent to an energy difference $\Delta E_{12}$ between two ground levels of the alkali metal atoms, are irradiated on the alkali metal atoms, the alkali metal atoms cause an EIT phenomenon. As the number of alkali metal atoms that cause the EIT phenomenon is larger, the intensity of the light transmitted through the gas cell 2120 increases and a voltage level of the output signal of the photodetector 2130 is higher.

The output signal of the photodetector 2130 is input to the detector circuit 2140 and the detector circuit 2170. The detector circuit 2140 subjects the output signal of the photodetector 2130 to synchronous detection using an oscillation signal of the low-frequency oscillator 2160 that oscillates at a low frequency of about several hertz to several hundred hertz.

The current driving circuit 2150 generates a driving current having magnitude corresponding to the output signal of the detector circuit 2140, supplies the driving current to the light-emitting device 40 of the light-emitting device module 100, and controls the center wavelength $\lambda_0$ (the center frequency $f_0$) of the emitted light of the light-emitting device 40. Specifically, concerning a wavelength $\lambda_1$ (a frequency $f_1$) equivalent to an energy difference between an excited level of the alkali metal atoms and a first ground level and a wavelength $\lambda_2$ (a frequency $f_2$) equivalent to an energy difference between the excited level of the alkali metal atoms and a second ground level, the center wavelength $\lambda_0$ is controlled to coincide with $(\lambda_1+\lambda_2)/2$ (the center frequency $f_0$ is controlled to coincide with $(f_1+f_2)/2$).

However, the center wavelength $\lambda_0$ does not need to be controlled to accurately coincide with $(\lambda_1+\lambda_2)/2$. The center wavelength $\lambda_0$ may be a wavelength in a predetermined range centering on $(\lambda_1+\lambda_2)/2$. In order to enable the synchronous detection by the detector circuit 2140, an oscillation signal of the low-frequency oscillator 2160 (a signal same as the oscillation signal supplied to the detector circuit 2140) is superimposed on the driving current generated by the current driving circuit 2150.

The center wavelength $\lambda_0$ (the center frequency $f_0$) of the light generated by the light-emitting device 40 is finely adjusted according to a feedback loop that passes the light-emitting device 40 of the light-emitting device module 100, the gas cell 2120, the photodetector 2130, the detector circuit 2140, and the current driving circuit 2150.

The detector circuit 2170 subjects the output signal of the photodetector 2130 to synchronous detection using the oscillation signal of the low-frequency oscillator 2200 that oscillates at a low frequency of about several hertz to several hundred hertz. An oscillation frequency of the voltage controlled crystal oscillator (VCXO) 2180 is finely adjusted according to the magnitude of the output signal of the detector circuit 2170. The voltage controlled crystal oscillator (VCXO) 2180 oscillates at, for example, about several megahertz to several ten megahertz.

The modulation circuit 2190 modulates an output signal of the voltage controlled crystal oscillator (VCXO) 2180 using the oscillation signal of the low-frequency oscillator 2200 as a modulation signal in order to enable the synchronous detection by the detector circuit 2170. The modulation circuit 2190 can be realized by a frequency mixer, a frequency modulation (FM) circuit, an amplitude modulation (AM) circuit, or the like.

The frequency conversion circuit 2210 converts an output signal of the modulation circuit 2190 into a signal having a half frequency of a frequency equivalent to $\Delta E_{12}$. The frequency conversion circuit 2210 can be realized by, for example, a PLL (Phase Locked Loop) circuit.

In the atomic oscillator 2000 having such a configuration, when it is assumed that an EIT signal is symmetrical, the frequency of the output signal of the frequency conversion circuit 2210 is finely adjusted to accurately coincide with the half frequency of the frequency equivalent to $\Delta E_{12}$ according to a feedback loop that passes the light-emitting device 40 of the light-emitting device module 100, the gas cell 2120, the photodetector 2130, the detector circuit 2170, the voltage controlled crystal oscillator (VCXO) 2180, the modulation circuit 2190, and the frequency conversion circuit 2210. For example, if the alkali metal atoms are cesium atoms, since the frequency equivalent to $\Delta E_{12}$ is 9.192631770 GHz, the frequency of the output signal of the frequency conversion circuit 2210 is 4.596315885 GHz.

As explained above, the output signal of the frequency conversion circuit 2210 is used as the modulation signal (a modulation frequency fm). The light-emitting device of the light-emitting device module 100 generates a plurality of lights including a resonance light pair and irradiates the lights on the gas cell 2120.

The atomic oscillator 2000 includes the light-emitting device module 100 that can suppress a temperature fluctuation of the light-emitting device 40. Therefore, the light-emitting device 40 of the light-emitting device module 100 can irradiate light having high frequency accuracy on the gas cell 2120. Therefore, the atomic oscillator 2000 can stably operate.

The embodiments and the modifications are examples. The present invention is not limited to the embodiments and the modifications. For example, the embodiments and the modifications can be combined as appropriate.

The present invention includes configurations substantially the same as the configurations explained in the embodiments (e.g., configurations having functions, methods, and results same as the functions, methods, and results of the embodiments or configurations having purposes and effects same as the purposes and effects of the embodiments). The present invention includes a configuration obtained by replacing unessential portions of the configurations explained in the embodiments. The present invention includes configurations that attain action and effects same as the action and effects of the configurations explained in the embodiments or configurations that can attain purposes same as the purposes of the embodiments). The present invention includes configurations obtained by adding publicly-known techniques to the configurations explained in the embodiments.

The entire disclosure of Japanese Patent Application No. 2012-024160, filed Feb. 7, 2012 is expressly incorporated by reference herein.

What is claimed is:

1. A light-emitting device module comprising:
   a temperature variable device including a temperature control surface subjected to temperature control, the temperature control surface having a first area and a second area different from the first area;
   a light-emitting device including a first electrode and mounted on the first area of the temperature control surface;
   a first terminal for supplying electric power to the first electrode; and
   a wire that causes the first terminal and the first electrode to conduct, wherein the temperature control surface has electrical conductivity,
   the wire includes a first wire, and one end of the first wire is joined to the first terminal and the other end of the first wire is joined to the second area of the temperature control surface, and
   the first terminal and the first electrode conduct via the temperature control surface.

2. The light-emitting device module according to claim 1, wherein the wire includes a second wire, and one end of the second wire is joined to the first electrode and the other end of the second wire is thermally connected to second area of the temperature control surface.

3. The light-emitting device module according to claim 1, wherein
   the first electrode is arranged on a surface other than a mounting surface of the light-emitting device, and
   the wire includes a second wire, and one end of the second wire is joined to the first electrode and the other end of the second wire is thermally connected to the second area of the temperature control surface.

4. The light-emitting device module according to claim 1, wherein the first electrode is joined to the temperature control surface.

5. The light-emitting device module according to claim 2, further comprising:
   a first insulating member mounted on the second area of the temperature control surface; and
   a first pad arranged on a surface of the first insulating member, wherein
   the other end of the first wire and the other end of the second wire are joined to the first pad.

6. The light-emitting device module according to claim 5, wherein
   the light-emitting device includes a second electrode, and the light-emitting device module further comprises:
   a second terminal for supplying electric power to the second electrode;
   a second insulating member mounted on the second area of the temperature control surface;
   a second pad arranged on the surface of the second insulating member;
   a third wire, one end of which is joined to the second terminal and the other end of which is joined to the second pad; and
   a fourth wire, one end of which is joined to the second electrode and the other end of which is joined to the second pad.

7. The light-emitting device module according to claim 2, wherein the light-emitting device module includes a plurality of the second wires.

8. An atomic oscillator comprising the light-emitting device module according to claim 1.

9. An atomic oscillator comprising the light-emitting device module according to claim 2.

10. An atomic oscillator comprising the light-emitting device module according to claim 3.

11. An atomic oscillator comprising the light-emitting device module according to claim 4.

12. An atomic oscillator comprising the light-emitting device module according to claim 5.

13. An atomic oscillator comprising the light-emitting device module according to claim 6.

14. An atomic oscillator comprising the light-emitting device module according to claim 7.

* * * * *